United States Patent
Aoki et al.

(10) Patent No.: US 9,163,804 B2
(45) Date of Patent: Oct. 20, 2015

(54) LIGHTING DEVICE

(71) Applicant: PANASONIC CORPORATION, Osaka (JP)

(72) Inventors: Shinichi Aoki, Osaka (JP); Makoto Yamada, Osaka (JP); Masaki Ishiwata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 117 days.

(21) Appl. No.: 13/869,122

(22) Filed: Apr. 24, 2013

(65) Prior Publication Data

US 2013/0301236 A1    Nov. 14, 2013

(30) Foreign Application Priority Data

May 11, 2012    (JP) .................................. 2012-110051

(51) Int. Cl.
- *F21V 9/00* (2015.01)
- *F21V 13/00* (2006.01)
- *H01L 33/44* (2010.01)
- *F21V 9/16* (2006.01)
- *H01L 33/50* (2010.01)

(52) U.S. Cl.
CPC . *F21V 13/00* (2013.01); *F21V 9/16* (2013.01); *H01L 33/44* (2013.01); *H01L 33/502* (2013.01); *H01L 33/504* (2013.01)

(58) Field of Classification Search
CPC .................................... F21V 13/00; F21V 9/16
USPC .................... 362/231, 230, 227, 84
See application file for complete search history.

(56) References Cited

U.S. PATENT DOCUMENTS

| | | | |
|---|---|---|---|
| 8,040,041 B2 * | 10/2011 | Hosokawa et al. | 313/503 |
| 8,773,009 B2 | 7/2014 | Aoki et al. | |
| 8,841,831 B2 | 9/2014 | Takei | |
| 2002/0080501 A1 * | 6/2002 | Kawae et al. | 359/799 |
| 2007/0064407 A1 | 3/2007 | Huang et al. | |
| 2007/0205711 A1 | 9/2007 | Takashima et al. | |
| 2010/0157573 A1 | 6/2010 | Toda et al. | |
| 2011/0016785 A1 | 1/2011 | Yamada et al. | |
| 2012/0112640 A1 | 5/2012 | Maxik et al. | |
| 2012/0300432 A1 | 11/2012 | Matsubayashi et al. | |

(Continued)

FOREIGN PATENT DOCUMENTS

| | | |
|---|---|---|
| CN | 101030620 | 4/2010 |
| CN | 101749578 | 6/2010 |

(Continued)

OTHER PUBLICATIONS

U.S. Appl. No. 13/868,183 to Naohiro Toda et al., filed Apr. 23, 2013.

(Continued)

*Primary Examiner* — Vip Patel
(74) *Attorney, Agent, or Firm* — Greenblum & Bernstein P.L.C.

(57) ABSTRACT

A lighting device includes an LED light source that emits light having a first peak wavelength in a range from 200 to 470 nm and a second peak wavelength in a range from 460 to 700 nm. An emission intensity at the second peak wavelength is greater than an emission intensity at the first peak wavelength, and an emission intensity at a wavelength band of 720 nm or greater is one tenth or less than an emission intensity at the second peak wavelength.

14 Claims, 5 Drawing Sheets

(56) References Cited

U.S. PATENT DOCUMENTS

| | | |
|---|---|---|
| 2013/0155647 A1 | 6/2013 | Tsukitani et al. |
| 2013/0169146 A1 | 7/2013 | Aoki et al. |
| 2013/0241391 A1 | 9/2013 | Takei |

FOREIGN PATENT DOCUMENTS

| | | |
|---|---|---|
| CN | 101387379 | 10/2010 |
| CN | 102287740 | 12/2011 |
| CN | 103162132 | 6/2013 |
| CN | 103363345 | 10/2013 |
| JP | 2001-028947 | 2/2001 |
| JP | 2002-027831 | 1/2002 |
| JP | 2002-199816 | 7/2002 |
| JP | 2004-121217 | 4/2004 |
| JP | 2005-027521 | 2/2005 |
| JP | 2007-280735 | 10/2007 |
| JP | 2009-224148 | 10/2009 |
| JP | 2009-261267 | 11/2009 |
| JP | 2009-261311 | 11/2009 |
| JP | 2010145732 | * 7/2010 |
| TW | I261378 | 9/2006 |
| TW | M406134 | 6/2011 |
| WO | 2006/132533 | 12/2006 |
| WO | 2008/025723 | 3/2008 |

OTHER PUBLICATIONS

U.S. Appl. No. 13/905,485 to Yoko Matsubayashi, filed May 30, 2013.

China Office action, dated Sep. 24, 2014 along with an English translation thereof.

Taiwan Office action, mail date is Jan. 26, 2015.

Search report from E.P.O., mail date is Jul. 13, 2015.

Office Action issued in Japan Counterpart Patent Appl. No. 2012-110051, dated Aug. 11, 2015.

* cited by examiner

Fig.3

| | 1st Peak Wavelength P1 (nm) | 2nd Peak Wavelength P2 (nm) | Bottom Wavelength Having Emission Intensity That is 1/10 of 2nd Peak Wavelength | Short Wavelength Cut Filter | Intensity at 660 nm or 730 nm | Insect Attraction | Effect on Plants |
|---|---|---|---|---|---|---|---|
| Example 1 | 445 | 630 | — | — | 1/10 at 730 nm | 90 | △ |
| Example 2 | 445 | 630 | 485-500 | — | 1/10 at 730 nm | 70 | △ |
| Example 3 | 445 | 630 | — | — | 1/10 at 660 nm | 60 | ○ |
| Example 4 | 410 | 610 | — | Cut 380 nm or less | Approximately 0 at 700-800 nm | 90 | ○ |
| Comparative Example 1 | 455 | 630 | — | — | — | 120 | × |
| Comparative Example 2 | 455 | 630 | — | — | — | 100 | × |

Fig.9
| | Insect Attraction | Effect on Plants |
|---|---|---|
| Example 5 | 55 | ○ |
| Example 6 | 30 | ○ |
Fig.10
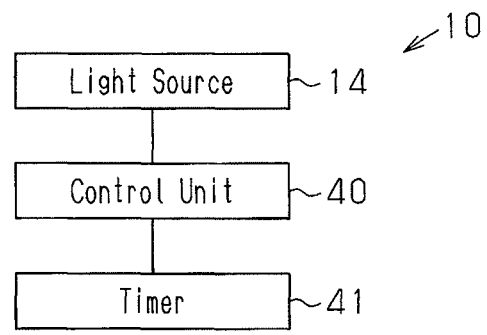
Fig.11
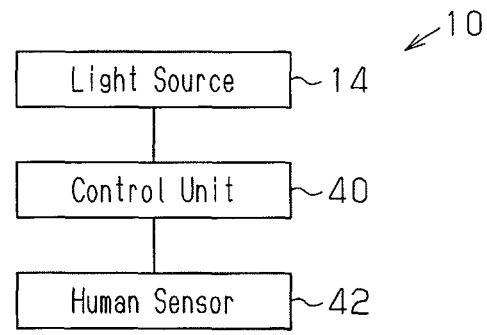

LIGHTING DEVICE

CROSS-REFERENCE TO RELATED APPLICATIONS

This application is based upon and claims the benefit of priority from prior Japanese Patent Application No. 2012-110051, filed on May 11, 2012, the entire contents of which are incorporated herein by reference.

BACKGROUND ART

The disclosure relates to a lighting device.

It is generally understood that insects, especially those that fly, are attracted to light having a peak wavelength in the ultraviolet band. Japanese Laid-Open Patent Publication No. 2009-224148 describes an example of a lighting device provided with an LED light source that includes a blue LED element to generate light with less ultraviolet rays. The lighting device attracts less insects as compared with a fluorescent lamp or the like. In addition to the LED light source, which is formed by a blue LED element and a yellow fluorescent body, the lighting device of the above publication includes a red LED element that emits red light, which has a longer wavelength than 500 nm.

However, the above publication does not take into consideration the effect that the lighting device has on plants. When activated at nighttime, the lighting device of the above publication may generate light that harms plants.

SUMMARY

One aspect of the present invention is a lighting device including an LED light source configured to emit light having a first peak wavelength in a range from 200 to 470 nm and a second peak wavelength in a range from 460 to 700 nm. An emission intensity at the second peak wavelength is greater than an emission intensity at the first peak wavelength, and an emission intensity at a wavelength band of 720 nm or greater is one tenth or less than an emission intensity at the second peak wavelength.

Preferably, the LED light source is configured to emit the light that has the second peak wavelength in a range from 460 to 580 nm and a bottom wavelength between the first peak wavelength and the second peak wavelength. An emission intensity at the bottom wavelength is one tenth or less than the emission intensity at the second peak wavelength.

Preferably, the LED light source emits the light having an emission intensity in a wavelength band of 380 nm or less that is one twentieth of the emission intensity at the first peak wavelength.

Preferably, the LED light source emits the light having an emission intensity in a wavelength band of 720 nm or greater that is one twentieth of the emission intensity at the first peak wavelength.

Preferably, the LED light source has a directivity adjusted to illuminate a plant with light, and the lighting device further includes a further light source having directivity adjusted to illuminate an object other than the plant with light having a light bulb color.

Preferably, the LED light source has a directivity adjusted to illuminate a plant with light, the lighting device further includes a further light source that emits light having a bottom wavelength in a range from 460 to 540 nm, and the further light source emits light having directivity adjusted to illuminate an object other than the plant.

Preferably, the lighting device further includes a control unit that activates the LED light source at nighttime from twenty-two o'clock and onward.

Preferably, the lighting device further includes a human sensor. The LED light source is configured to be activated when the human sensor detects a person.

Preferably, the lighting device is configured to emit the light from the LED light source as illumination light.

BRIEF DESCRIPTION OF THE DRAWINGS

The invention, together with objects and advantages thereof, may best be understood by reference to the following description of the presently preferred embodiments together with the accompanying drawings in which:

FIG. 3 is a chart illustrating illumination light for examples and comparative examples;

FIG. 9 is a chart illustrating the effects of examples 5 and 6;

FIG. 10 is a block diagram showing a first modification of the lighting device; and FIG. 11 is a block diagram showing a second modification of the lighting device.

DETAILED DESCRIPTION OF EMBODIMENTS

A lighting device according to one embodiment of the present invention will now be described.

Figure 1A:
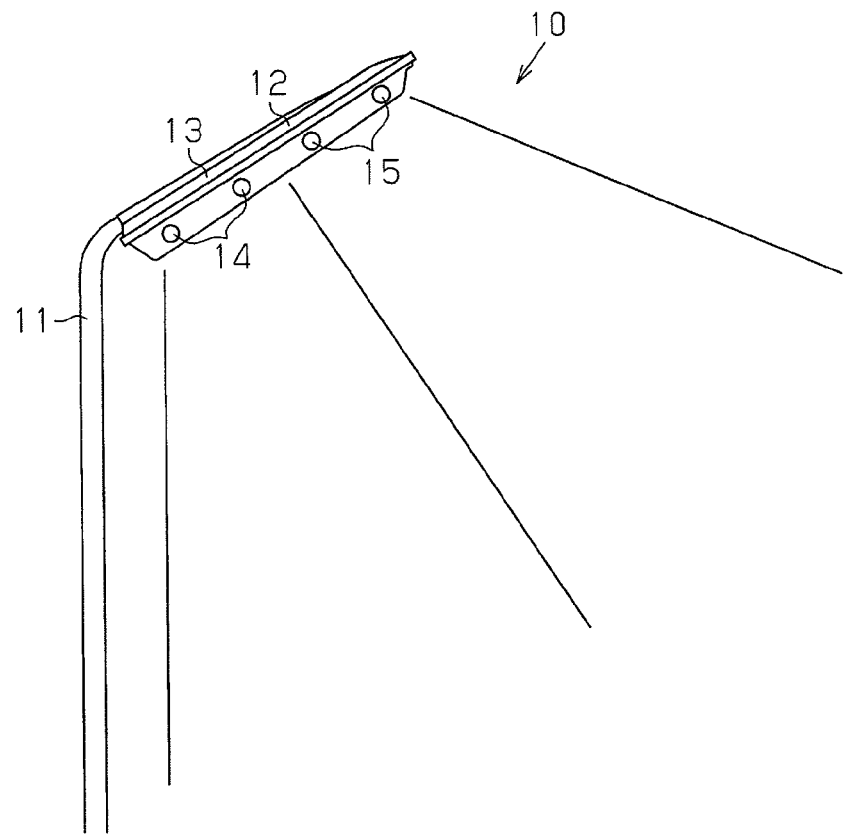
FIGS. 1A and 1B are schematic diagrams showing one embodiment of a lighting device.

As shown in FIG. 1A, a lighting device 10 of the present embodiment includes first light sources 14. The first light sources 14 are arranged on a main body 12, which is coupled to a distal end of a pole 11. In the example shown in FIGS. 1A and 1B, the main body 12 includes a housing 13 that accommodates the first light sources 14 and second light sources 15. The first light sources 14 and the second light sources 15 have different spectral distributions (emission spectra).

Figure 1B:
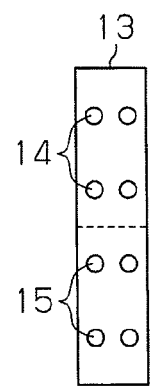

Further, in the example shown in FIGS. 1A and 1B, each first light source 14 includes a blue LED element 16, a yellow fluorescent body 17, and a filter 18. The blue LED element 16 may be, for example, an InGaN blue LED element although other elements may also be used. The yellow fluorescent body 17 may be, for example, a member or layer that mixes silicone resin as a matrix with a fluorescent component as an additive although other material may be used. The first light sources 14 form an LED light source.

Figure 2A:
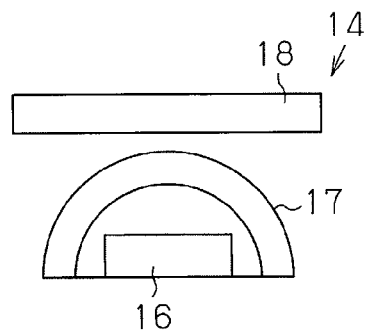
FIG. 2A is a schematic diagram showing a light source.
Figure 2B:
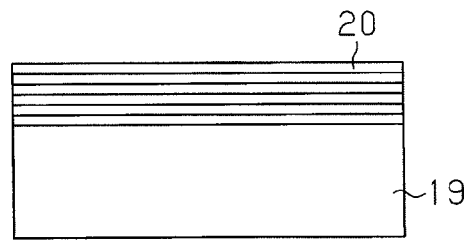
FIG. 2B is a schematic diagram showing a filter.

As shown in FIG. 2A, the filter 18 is arranged in front of the blue LED element 16 and the yellow fluorescent body 17. Referring to FIG. 2B, the filter 18 may include an optical multilayer film 20 superimposed on the surface of soda glass plate 19. The optical multilayer film 20 has a controlled wavelength selectivity. That is, the optical multilayer film 20 selectively cuts or weakens light in a predetermined wavelength band from the light emitted from the blue LED element 16 and the yellow fluorescent body 17. The optical multilayer film 20 is configured to selectively cut or weaken light in, for example, a wavelength range at the vicinity of 720 nm.

Each second light source 15 has the same structure as the first light source 14 except in that the filter 18 is omitted. In the example shown in FIG. 1A, the first light sources 14 are arranged in the housing 13 at the basal side of the main body 12. The second light sources 15 are arranged in the housing 13 at the distal side of the main body 12. Preferably, the first light sources 14 and the second light sources 15 are configured to illuminate different regions. For example, the first light sources 14 are preferably configured to have a directivity adjusted to mainly illuminate the proximity of the basal end of the pole 11, and the second light sources 15 are preferably configured to have a directivity adjusted to mainly illuminate remote locations other than the proximity of the basal end of the pole 11. In this case, when the lighting device 10 is used as a street light, a plant such as a street tree located under the first light sources 14 in the proximity of the pole 11 is illuminated with the light from the first light sources 14. Objects at a remote location are illuminated with the light from the second light sources 15. Preferably, the plant illuminated with the light from the first light sources 14 is not illuminated by the light from the second light sources 15.

The inventors of the present invention conducted tests to evaluate the insect attraction of the first light sources 14 and the effect on plants.

Example 1

Figure 4:
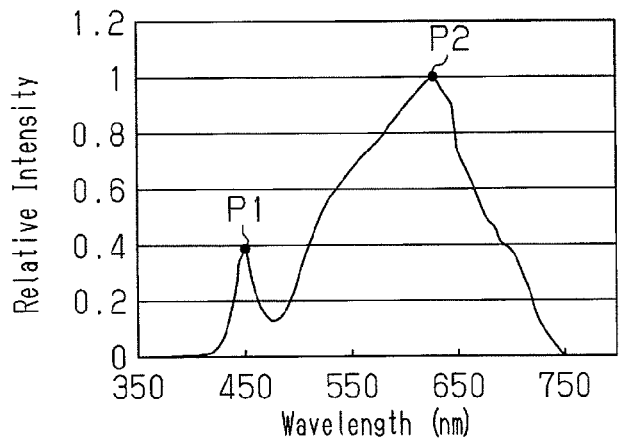
FIG. 4 is an emission spectrum chart for a lighting device of example 1.

As shown in FIG. 4, the first light source 14 of example 1 emitted light having a first peak wavelength P1 at 445 nm and a second peak wavelength P2 at 630 nm. In example 1, the light emission intensity at 730 nm is one tenth or less than the intensity at the second peak wavelength P2. The blue LED element 16 and the yellow fluorescent body 17 in the first light source 14 of the first embodiment were formed by Nichia 119 (manufactured by Nichia Corporation) having a color temperature of approximately 2700 K. The optical multilayer film 20 of the first light source 14 in example 1 is configured to weaken light in the vicinity of 720 nm.

Example 2

Figure 5:
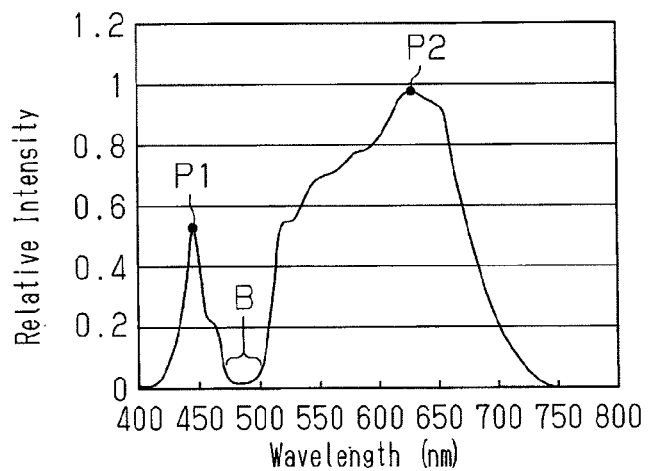
FIG. 5 is an emission spectrum chart for a lighting device of example 2.

In addition to example 1, the optical multilayer film 20 of the first light source 14 in example 2 is configured to weaken light in a range between the first peak wavelength P1 and the second peak wavelength P2, to have a bottom wavelength B in a range from 485 to 500 nm. More specifically, as shown in FIG. 5, the first light source 14 of example 2 emits light having a first peak wavelength P1 at 445 nm, a second peak wavelength P2 at 630 nm, and a bottom wavelength B in a range from 485 to 500 nm, which is the range between the first peak wavelength P1 and the second peak wavelength P2. The emission intensity at the bottom wavelength B is one tenth or less than the emission intensity at the second peak wavelength P2. Otherwise, example 2 is the same as example 1.

Example 3

In addition to example 1, the optical multilayer film 20 in example 3 is configured to weaken light so that the light emission intensity at 660 nm is one tenth or less than the intensity at the second peak wavelength P2. Otherwise, example 3 is the same as example 1.

Example 4

In example 4, the optical multilayer film 20 is configured to weaken light at the wavelength band of 710 nm or higher.

Figure 6:
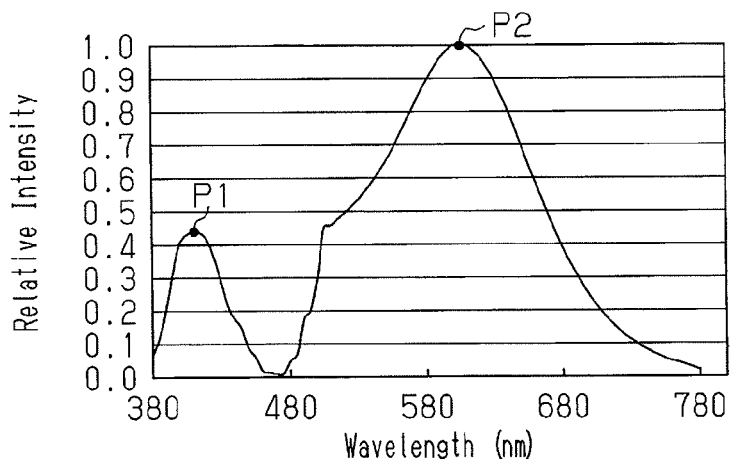
FIG. 6 is an emission spectrum chart for a lighting device of example 4.

Instead of the soda glass plate 19, the optical multilayer film 20 is superimposed on a resin substrate that contains an ultraviolet absorbing agent to absorb light in the wavelength band of 380 nm or less. As shown in FIG. 6, the first light source 14 of example 4 emits light having a first peak wavelength P1 at 410 nm and a second peak wavelength P2 at 610 nm. In example 4, the emission intensity at 380 nm or less and in the range from 700 to 800 nm is generally zero.

Comparative Example 1

Figure 7:
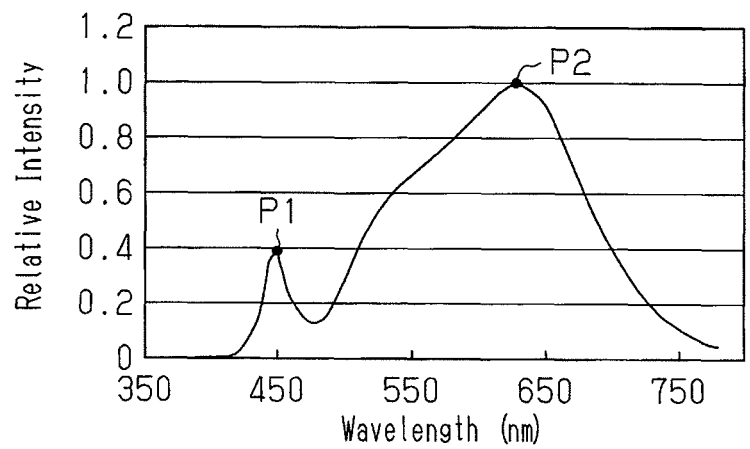
FIG. 7 is an emission spectrum chart for a lighting device of comparative example 1.

The optical multilayer film 20 is omitted in comparative example 1. Otherwise, comparative example 1 is the same as example 1. As shown in FIG. 7, in comparative example 1, the first peak wavelength P1 is 455 nm, and the second peak wavelength P2 is 630 nm. The emission intensity at 455 nm is 0.4 when the emission intensity at 630 nm is equal to 1.

Comparative Example 2

In comparative example 2, the first peak wavelength P1 is 455 nm, and the second peak wavelength P2 is 630 nm. Comparative example 2 differs from comparative example 1 in that the emission intensity at 455 nm is 0.27 when the emission intensity at 630 nm is equal to 1.

Figure 8A:
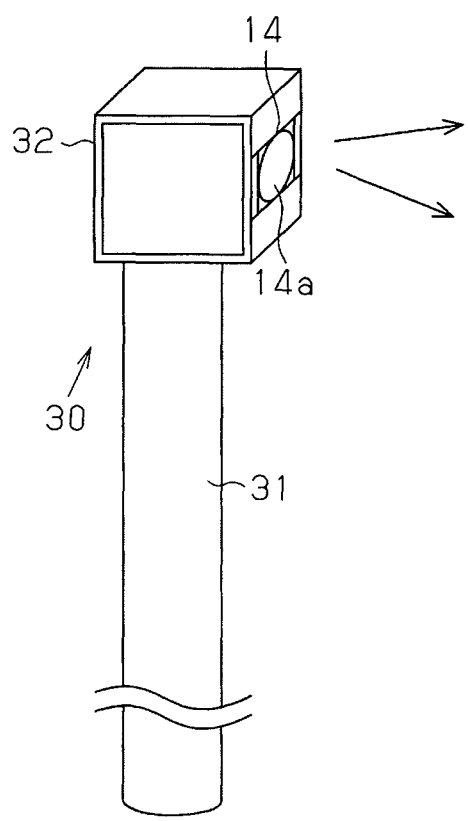
FIGS. 8A and 8B are schematic views showing an evaluation device.
Figure 8B:
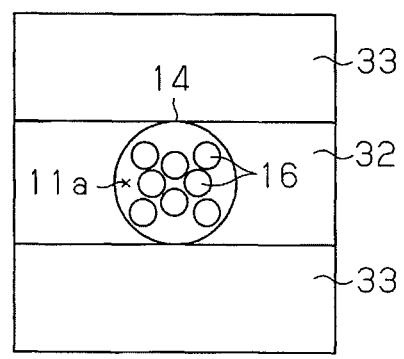

Evaluation tests were conducted on examples 1 to 4 and comparative examples 1 and 2. An evaluation device 30 shown in FIG. 8A is used to conduct the evaluation tests. Referring to FIG. 8A, the evaluation device 30 includes the first light source 14, which is accommodated in a generally box-shaped accommodation portion 32 coupled to the upper end of a pole 31. The first light source 14 includes a light emission surface 14a that is visible from one side of the accommodation portion 32. As shown in FIG. 8B, adhesive traps 33 are arranged above and below the light emission surface 14a of the first light source 14 in the accommodation portion 32. An adhesive agent is applied to the surface of each adhesive trap 23, the dimensions of which are 200 mm×500 mm.

The evaluation device 30 was arranged in a 10 m×10 m room and activated to emit light from the first light source 14 with three kinds of insects (flies, diamondback moths, and the like), 400 each, released in the room for one hour. Then, the number of insects caught on the adhesive traps 33 was counted. In FIG. 3, the item of insect attraction uses the number of insects caught by comparative example 2 as a standard, or reference value (100), to indicate the number of insects caught by each example and comparative example.

A similar evaluation device 30 was used to illuminate plants (stubs of chrysanthemums) with light in a greenhouse. The conditions of the plants were observed. In FIG. 3, under the item shown as influence on plants, a circle indicates that there were no effects on the plants, a triangle indicates that there were slight effects on the plants, and a cross indicates that there were great effects on the plants.

In comparison examples 1 and 2 formed by the blue LED element 16 and the fluorescent body 17, the insect attraction was 100 or greater, and there were great effects on the plants.

In examples 1 to 4, the first light source 14 emitted light having a first peak wavelength P1 in the range from 200 to 470 nm and a second peak wavelength P2 in the range from 460 to 700 nm. The emission intensity at the second peak wavelength P2 was higher than the emission intensity at the first peak wavelength P1. The emission intensity in the wavelength band of 720 nm or greater was one tenth or less than the emission intensity at the second peak wavelength P2. As a result, as shown in FIG. 3, the insect attraction was decreased as compared with comparative examples 1 and 2. Further, the effect on the plants was reduced.

When the emission intensity in the wavelength band of 380 nm or lower and the range from 700 to 800 nm was one twentieth or less of the spectral density at the first peak wavelength P1 like in example 4, the insect attraction was further decreased, and the effect on the plants was further reduced.

The present embodiment has the advantages described below.

(1) The lighting device 10 includes the first light source 14 that emits light having a first peak wavelength P1 in the range from 200 to 470 nm and a second peak wavelength P2 in the range from 460 to 700 nm. The emission intensity at the second peak wavelength P2 is higher than the emission intensity at the first peak wavelength P1. The emission intensity in the wavelength band of 720 nm or greater is one tenth or less than the emission intensity at the second peak wavelength P2. As a result, the lighting device 10 decreases the insect attraction to 90 or less and reduces the effect on plants.

(2) The first light source 14 emits light having an emission intensity in the wavelength band of 380 nm or less that is one twentieth or less of the spectral density at the first peak wavelength P1. Further, the first light source 14 is formed so that the emission intensity is 0 at the wavelength band of 700 nm or greater. As a result, the lighting device 10 decreases the insect attraction to 90 or less and further reduces the effect on plants.

(3) The lighting device 10 includes the first light source 14 and the second light source 15, which has a peak wavelength in the range from 200 to 470 nm and a bottom wavelength in the range from 460 to 540 nm. The first light source 14 has a directivity adjusted to emit light toward a plant. The second light source 15 has a directivity adjusted to emit light toward an object other than a plant. Accordingly, the second light source 15 improves the visibility of objects under mesopic vision conditions, and the first light source 14 reduces the effects on plants.

The above embodiment may be modified as described below.

In the above embodiment, the lighting device 10 includes the first and second light sources 14 and 15, which are arranged in the housing 13 of the main body 12. However, the second light sources 15 may be omitted. In this case, the first light sources 14 form the LED light source.

In the above embodiment, the second light source 15 is formed by eliminating the filter 18 from the first light source 14. Instead, the second light source 15 may be formed by an LED element and a fluorescent body that differs from the blue LED element 16 and the yellow fluorescent body 17 of the first light source 14.

For example, the second light source 15 may include an LED element that emits light having the color temperature of a light bulb. A lighting device 10 that includes such a second light source 15 improves the appearance (color rendering) in the illuminated area that does not include a plant.

As shown in FIG. 10, the lighting device 10 may include a control unit 40 that controls the activation and deactivation of the first light sources 14 in accordance with the time managed by a timer 41. For example, when the control unit 40 activates the first light source 14 only during nighttime, the power consumption of the lighting device 10 may be decreased. In the same manner, the control unit 40 may control the activation and deactivation of the second light sources 15 in accordance with the time. Preferably, the first light sources 14 are activated when the surrounding environment becomes dark and insects tend to gather at the lighting device, for example, after twenty-two o'clock.

The inventors of the present invention conducted tests to evaluate insect attraction and the effect on plants when controlling the activation time of the first light sources 14. In example 5, the timer 41 activates the first light source 14 at twenty-two o'clock and deactivates the first light source 14 in the morning. As shown in FIG. 9, the insect attraction was decreased to 55, and the effect on plants was small.

In the example shown in FIG. 11, the lighting device 10 includes a control unit 40 that activates and deactivates the first light sources 14 in accordance with the detection result of a human sensor 42. For example, when the human sensor 42 detects a person, the control unit 40 activates the first light source 14. This structure allows for the first light sources 14 to be activated only when a person is near the lighting device 10. This reduces power consumption. In the same manner, the control unit 40 may control the activation and deactivation of the second light sources 15 in accordance with the detection result of the human sensor 42.

The inventors of the present invention conducted tests to evaluate insect attraction and the effect on plants for a lighting device including the human sensor 42. In example 6, the first light source 14 was activated for five minutes whenever the human sensor 42 detected a person. This was repeated three times. The insect attraction was 30, and the effect on plants was also small.

In one embodiment, two optical multilayer films may be superimposed on opposite surfaces of a substrate such as the soda glass plate 19 or the resin substrate.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:

1. A lighting device comprising:
an LED light source configured to generate light; and
a filter having a wavelength selectivity configured to selectively weaken or cut the light from the light source to emit illumination light having a first peak wavelength in a range from 200 to 470 nm and a second peak wavelength in a range from 460 to 700 nm, wherein an emission intensity at the second peak wavelength of the illumination light is greater than an emission intensity at the first peak wavelength, and an emission intensity of the illumination light at 720 nm is one tenth or less than an emission intensity at the second peak wavelength.

2. The lighting device according to claim 1, wherein the LED light source and filter are configured to emit light that has the second peak wavelength in a range from 460 to 580 nm and a bottom wavelength between the first peak wavelength and the second peak wavelength, wherein an emission intensity at the bottom wavelength is one tenth or less than the emission intensity at the second peak wavelength.

3. The lighting device according to claim 1, wherein the LED light source generates light having an emission intensity in a wavelength band of 380 nm or less that is one twentieth of the emission intensity at the first peak wavelength.

4. The lighting device according to claim 1, wherein the LED light source generates light having an emission intensity in a wavelength band of 720 nm or greater that is one twentieth of the emission intensity at the first peak wavelength.

5. The lighting device according to claim 1, wherein the LED light source has a directivity adjusted to illuminate a plant with light, and the lighting device comprises a further light source having a directivity adjusted to illuminate an object other than the plant with light having a light bulb color.

6. The lighting device according to claim 1, wherein the LED light source has a directivity adjusted to illuminate a plant with light, and the lighting device comprises a further light source that emits light having a bottom wavelength in a range from 460 to 540 nm, and the further light source emits light having a directivity adjusted to illuminate an object other than the plant.

7. The lighting device according to claim 1, further comprising a controller that activates the LED light source from twenty-two o'clock and onward.

8. The lighting device according to claim 1, further comprising a human sensor, wherein the LED light source is configured to be activated when the human sensor detects a person.

9. The lighting device according to claim 1, wherein the LED light element includes a blue LED light element.

10. The light device according to claim 1, wherein the filter includes an optical multilayer film superimposed on a soda glass plate or on a resin substrate, the optical multilayer film having a controlled wavelength selectivity.

11. The lighting device according to claim 1, wherein the LED light element includes a blue LED light element and the filter includes an optical multilayer film superimposed on a soda glass plate or on a resin substrate, the optical multilayer film having a controlled wavelength selectivity.

12. The lighting device according to claim 1, the LED light source comprising a blue LED element and a yellow fluorescent body, the filter positioned in front of the blue LED element and the yellow fluorescent body.

13. A lighting device comprising:
an LED light element;
a fluorescent body covering the LED light element; and
a filter having a wavelength selectivity configured to selectively weaken light from the LED light element and the fluorescent body, and to emit illumination light having a first peak wavelength in a range from 200 to 470 nm and a second peak wavelength in a range from 460 to 700 nm, wherein an emission intensity at the second peak wavelength of the illumination light is greater than an emission intensity at the first peak wavelength, and an emission intensity of the illumination light at 720 nm is one tenth or less than an emission intensity at the second peak wavelength.

14. The lighting device according to claim 13, wherein the LED light element includes a blue LED light element and the filter includes an optical multilayer film superimposed on a soda glass plate or on a resin substrate, the optical multilayer film having a controlled wavelength selectivity.

* * * * *